US010833231B2

(12) United States Patent
Kräuter et al.

(10) Patent No.: US 10,833,231 B2
(45) Date of Patent: Nov. 10, 2020

(54) METHOD FOR PRODUCING AN OPTOELECTRONIC COMPONENT, AND OPTOELECTRONIC COMPONENT

(71) Applicant: OSRAM OLED GMBH, Regensburg (DE)

(72) Inventors: Gertrud Kräuter, Regensburg (DE); Matthias Loster, Regensburg (DE); Kathy Schmidtke, Mainburg (DE); Alan Piquette, Kensington, NH (US)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/094,870

(22) PCT Filed: Apr. 13, 2017

(86) PCT No.: PCT/EP2017/058984
§ 371 (c)(1),
(2) Date: Oct. 18, 2018

(87) PCT Pub. No.: WO2017/182390
PCT Pub. Date: Oct. 26, 2017

(65) Prior Publication Data
US 2019/0123248 A1    Apr. 25, 2019

Related U.S. Application Data

(60) Provisional application No. 62/324,028, filed on Apr. 18, 2016.

(51) Int. Cl.
*H01L 33/56* (2010.01)
*C08G 77/18* (2006.01)
(Continued)

(52) U.S. Cl.
CPC ............ *H01L 33/56* (2013.01); *C08G 77/18* (2013.01); *C08J 3/24* (2013.01); *C08K 3/22* (2013.01);
(Continued)

(58) Field of Classification Search
CPC ........... H01L 2924/00; H01L 2924/181; H01L 2924/3025; H01L 2924/12044; H01L 33/56; H01L 2224/48247; H01L 23/296
See application file for complete search history.

(56) References Cited

U.S. PATENT DOCUMENTS 5,152,834 A * 10/1992 Allman .................. C08G 77/06
106/287.13
5,472,488 A * 12/1995 Allman .................. G03F 7/091
106/287.16
(Continued)

FOREIGN PATENT DOCUMENTS

CN        101506969 A     8/2009
CN        105038233 A    11/2015
(Continued)

OTHER PUBLICATIONS

"Highlights 2015," Evonik Industries AG, 2015, 8 pages.
(Continued)

*Primary Examiner* — Jaehwan Oh
(74) *Attorney, Agent, or Firm* — Slater Matsil, LLP

(57) ABSTRACT

An optoelectronic component and a method for producing an optoelectronic component are disclosed. In an embodiment a method for producing an optoelectronic component includes providing a semiconductor capable of emitting primary radiation, providing an alkoxy-functionalized polyorganosiloxane resin and crosslinking the alkoxy-functionalized polyorganosiloxane resin to form a three-dimensionally crosslinked polyorganosiloxane, wherein an organic
(Continued)

portion of the three-dimensionally crosslinked polyorganosiloxane is up to 25 wt %.

19 Claims, 3 Drawing Sheets

(51) Int. Cl.
    *C08J 3/24*      (2006.01)
    *C08K 3/22*      (2006.01)
    *C08K 3/28*      (2006.01)
    *C09D 183/06*      (2006.01)
    *C09K 11/02*      (2006.01)
    *C09K 11/08*      (2006.01)
    *H01L 33/50*      (2010.01)

(52) U.S. Cl.
    CPC .............. *C08K 3/28* (2013.01); *C09D 183/06* (2013.01); *C09K 11/02* (2013.01); *C09K 11/08* (2013.01); *C08K 2003/2227* (2013.01); *H01L 33/501* (2013.01); *H01L 33/507* (2013.01); *H01L 2933/005* (2013.01); *H01L 2933/0041* (2013.01)

(56) References Cited

U.S. PATENT DOCUMENTS

| | | | |
|---|---|---|---|
| 8,022,137 B2 * | 9/2011 | Taguchi | C08L 83/04 524/430 |
| 8,502,364 B2 | 8/2013 | Kato et al. | |
| 8,629,222 B2 * | 1/2014 | Takizawa | H01L 23/296 525/15 |
| 8,975,657 B2 * | 3/2015 | Haraguchi | H01L 33/486 257/100 |
| 9,644,057 B2 | 5/2017 | Toyota et al. | |
| 9,935,246 B2 | 4/2018 | Williams et al. | |
| 2006/0035092 A1 * | 2/2006 | Shimizu | C09D 183/04 428/447 |
| 2007/0027286 A1 * | 2/2007 | Blanc-Magnard | C08K 5/0091 528/31 |

FOREIGN PATENT DOCUMENTS

| | | |
|---|---|---|
| JP | 2006077234 A | 3/2006 |
| JP | 2009239242 A | 10/2009 |
| WO | 2014021419 A1 | 2/2014 |
| WO | 2015007778 A1 | 1/2015 |
| WO | 2015033824 A1 | 3/2015 |
| WO | 2015128460 A1 | 9/2015 |

OTHER PUBLICATIONS

Silikophen AC 1000, Methylpolysiloxan resin, Evonik Resource Efficiency GmbH, 2015, 2 pages.

Silikophen AC 900, Methylphenyl silicone resin, Evonik Resource Efficiency GmbH, 2015, 2 pages.

* cited by examiner

METHOD FOR PRODUCING AN OPTOELECTRONIC COMPONENT, AND OPTOELECTRONIC COMPONENT

This patent application is a national phase filing under section 371 of PCT/EP2017/058984, filed Apr. 13, 2017, which claims the priority of U.S. Application No. 62/324,028, filed Apr. 18, 2016, each of which is incorporated by reference in its entirety.

TECHNICAL FIELD

The invention is related to a method for producing an optoelectronic component. The invention is further related to an optoelectronic component.

BACKGROUND

Optoelectronic components, such as light emitting diodes or high-performance light emitting diodes (LEDs), generally have transparent components made of polyorganosiloxane (silicone). However, these transparent components do not exhibit sufficient temperature and blue light stability. Even other materials, as transparent components, are either not sufficiently blue light and temperature stable or require processing temperatures beyond the limits permitted for LED chips, such as glass. Less advantageous properties of conventional polyorganosiloxanes therefore lead to restrictions for the optoelectronic component due to a lack of alternatives. The limited temperature and blue light stability of the conventional polyorganosiloxanes used leads to the specification of a lower maximum ambient temperature, a lower thermal resistance to the heat sink and low nominal currents. High permeability can also be the reason for limiting the use of optoelectronic components. For example, atmospheres with a high sulfur or sulfide content or the presence of volatile organic compounds can diffuse into the optoelectronic component and damage it. In addition, due to the high temperature expansion of conventional silicones (250 to 300 ppm), a special housing adaptation is necessary to avoid delamination, for example. The conventional polyorganosiloxanes, which are available in a desired housing shape in particular, crosslink by addition catalysed by noble metals. The polymer chains combine in the curing process in which the Si—H bonds react with C—C double bonds in a polyaddition to form an Si—C bond.

SUMMARY OF THE INVENTION

Embodiments provide a process for producing an optoelectronic component that provides a stable optoelectronic component. In particular, the optoelectronic component produced is temperature and/or blue light stable. Further embodiments provide an optoelectronic component that is stable, especially stable to temperature and/or blue light.

In at least one embodiment, the method for producing an optoelectronic component comprises the steps: A) providing a semiconductor capable of emitting primary radiation, B) providing an alkoxy-functionalized polyorganosiloxane resin, in particular a methoxy-functionalized polyorganosiloxane resin, and C) crosslinking the alkoxy-functionalized polyorganosiloxane resin, in particular the methoxy-functionalized polyorganosiloxane resin, to form a three-dimensionally crosslinked polyorganosiloxane, wherein the organic portion of the three-dimensionally crosslinked polyorganosiloxane is up to 25 wt %, i.e., a maximum of 25 wt %.

The inventors have recognized that the method described here can produce a component with increased temperature and/or blue light stability compared to components with conventional silicones. The cross-linked polyorganosiloxane can be formed as lens, housing, casting material and/or converter element and is ideal for high-power LEDs.

According to at least one embodiment, the optoelectronic component comprises a semiconductor. The semiconductor comprises a semiconductor layer sequence. The semiconductor layer sequence of the semiconductor is preferably based on a III-V compound semiconductor material. The semiconductor material is preferably a nitride compound semiconductor material, such as $Al_nIn_{1-n-m}Ga_mN$ or also a phosphide compound semiconductor material, such as $Al_nIn_{1-n-m}Ga_mP$, where $0 \le n \le 1$, $0 \le m \le 1$ and $n+m \le 1$, respectively. The semiconductor material can also be $Al_xGa_{1-x}As$ with $0 \le x \le 1$. The semiconductor layer sequence can contain dopants and additional components. For simplicity's sake, however, only the essential components of the crystal lattice of the semiconductor layer sequence, i.e., Al, As, Ga, In, N or P, are given, even if these can be partially replaced and/or supplemented by small amounts of other substances.

The semiconductor layer sequence contains an active layer with at least one pn junction and/or with one or more quantum well structures. During operation of the semiconductor or semiconductor chip, electromagnetic radiation is generated in the active layer. The semiconductor is thus capable of emitting primary radiation. In particular, primary radiation is emitted via the main radiation surface of the semiconductor. In particular, the radiation main surface is oriented perpendicular to a growth direction of the semiconductor layer sequence of the optoelectronic component. Here and in the following the side surfaces of the semiconductor chip designate the side surfaces oriented parallel to a growth direction of the semiconductor layer sequence of the optoelectronic component. A wavelength of the primary radiation or the wavelength maximum of the primary radiation is preferably in the ultraviolet and/or visible and/or IR spectral range, especially at wavelengths between 420 nm and 800 nm inclusive, for example, between 440 nm and 480 nm inclusive.

According to at least one embodiment, the semiconductor is a light emitting diode, or LED for short. The semiconductor is then preferably equipped to emit blue light, green light, red light. If a converter element is present, the optoelectronic component is especially configured to emit white mixed light.

According to at least one embodiment, the method comprises the process step B) providing an alkoxy-functionalized polyorganosiloxane resin (1), in particular a methoxy-functionalized polyorganosiloxane resin. The alkoxy content of the alkoxy-functionalized polyorganosiloxane resin may be between 15 wt % and 40 wt % inclusive, in particular between 17 wt % and 35 wt % inclusive, for example, 17 wt % and 35 wt % inclusive.

According to at least one embodiment, the alkoxy-functionalized polyorganosiloxane resin is an alkoxy-functionalized methylphenyl silicone resin having an alkoxy content of 17+/−4 wt %. In particular, the alkoxy-functionalized polyorganosiloxane resin cures at room temperature by a hydrolysis and condensation reaction using catalysis with the addition of air humidity. Suitable catalysts are, for example, titanates in combination with a strong base According to at least one embodiment, the alkoxy-functionalized polyorganosiloxane resin is an alkoxy-functionalized methyl silicone resin having an alkoxy content of 35+/−4 wt %. In particular, the alkoxy-functionalized polyorganosiloxane resin is a dimethyl silicone resin.

In particular, the alkoxy-functionalized polyorganosiloxane resin has the positive property in the curing process and/or crosslinking process that it loses little volume or that its crosslinking products take up a small volume and can diffuse away. This prevents cracks and defects from forming at the layer thicknesses that occur. In addition, the resulting three-dimensionally crosslinked polyorganosiloxane has a sufficient high flexibility to allow the crack-free production of elements with a thickness of up to 300 μm, for example.

According to at least one embodiment, in method step B) phenyl- and/or methyl-substituted siloxanes are used which form polyorganosiloxanes in a condensation reaction with ambient humidity. Here too, layers of several μm, especially with a layer thickness of 20 to 80 μm, are possible without the formation of cracks or defects. The three-dimensional crosslinked polyorganosiloxane differs significantly from conventional silicones, which are commonly used today in the packaging of optoelectronic components. The three-dimensional crosslinked polyorganosiloxanes can be identified by IR spectroscopy or by determining their hardness and/or thermal stability.

According to at least one embodiment, step B) is carried out by casting, drop casting, spin coating, spray coating, compression molding and/or doctor blading.

According to at least one embodiment, the method comprises a method step C), crosslinking the alkoxy-functionalized polyorganosiloxane resin to form a three-dimensionally crosslinked polyorganosiloxane. In particular, the three-dimensionally crosslinked polyorganosiloxane is close meshed and forms a close meshed three-dimensional Si—O network. Close-meshed means here and in the following that the crosslinked polyorganosiloxane has an organic content of not more than 25 wt % after curing. In particular, the organic content of the three-dimensionally crosslinked polyorganosiloxane is between 13 wt % and 18 wt % inclusive or between 14 wt % and 16 wt % inclusive, for example, 15 wt %. The organic content can be determined by thermal gravimetric analysis (TGA) in air. In particular, the organic content is determined at a temperature of 500° C. or 1000° C. The incineration process can take place up to 500° C. or up to 1000° C. up to a constant weight. Organic contents can be methyl and/or phenyl radicals, for example.

According to at least one embodiment, crosslinking in step C) is a condensation crosslinking. The alkoxy-functionalized polyorganosiloxane resin is not crosslinked by addition reaction.

According to at least one embodiment, the crosslinked polyorganosiloxane has a Shore A hardness greater than 70. The determination of the Shore hardness is specified in the standards DIN-ISO 868 and DIN-ISO 7619-1.

According to at least one embodiment, the crosslinked polyorganosiloxane has a high temperature resistance. In particular, the polyorganosiloxane with $CH_3$ groups as organic radicals has a temperature resistance up to 250° C. and with $CH_3$ and phenyl groups as organic radicals a temperature resistance up to 280° C.

At least one filler is added to the crosslinked polyorganosiloxane or the alkoxy-functionalized polyorganosiloxane resin according to at least one embodiment. In particular, the filler is a titanium dioxide. The crosslinked polyorganosiloxane with the titanium dioxide is particularly resistant to temperatures up to 380° C.

According to at least one embodiment, the crosslinked polyorganosiloxane or the alkoxy-functionalized polyorganosiloxane resin is mixed with at least one phosphor, in particular a garnet. In particular, the crosslinked polyorganosiloxane then has a temperature resistance of up to 400° C.

According to at least one embodiment, the crosslinking is carried out in method step C) by means of temperature and/or humidity, in particular air humidity, or UV radiation. In particular, crosslinking takes place in method step C) at a temperature between room temperature and 220° C. In particular, crosslinking takes place in method step C) by means of temperature and humidity.

According to at least one embodiment, the mass of the crosslinked polyorganosiloxane produced in step C) remains constant at a temperature up to 200° C. Constant means here and in the following that a maximum mass difference of <5% or 2% or 1% is present. Mass difference here means the difference in mass of the polyorganosiloxane before and after crosslinking.

According to at least one embodiment, the crosslinked polyorganosiloxane has the following structural formula:

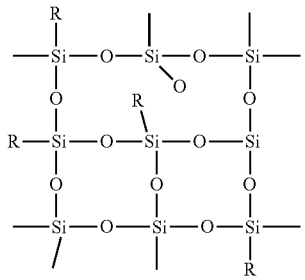

Here R is a methyl and/or phenyl radical respectively. The organic groups ensure good processability and compatibility with fillers.

According to at least one embodiment, the crosslinked polyorganosiloxane is formed as a converter element or the alkoxy-functionalized polyorganosiloxane resin is formed as a converter element. The crosslinked polyorganosiloxane is or is arranged in the beam path of the semiconductor. In particular, the converter element is or is arranged in direct mechanical and/or electrical and/or thermal contact with the semiconductor. In particular, the converter element is or is arranged directly on the radiation main surface of the semiconductor chip.

In accordance with at least one embodiment of the method, this additionally comprises step D):

Applying the alkoxy-functionalized polyorganosiloxane resin as a converter element at least on the radiation main surface of the semiconductor, wherein the converter element comprises at least one phosphor which converts the primary radiation into secondary radiation. In particular, the alkoxy-functionalized polyorganosiloxane resin is arranged as a converter element on the radiation main surface and on the side surfaces of the semiconductor chip. Alternatively, the alkoxy-functionalized polyorganosiloxane resin is arranged as a converter element only on the radiation main surface of the semiconductor chip.

In step D), the alkoxy-functionalized polyorganosiloxane resin is applied according to at least one embodiment of the method and the crosslinked polyorganosiloxane is formed as a converter element and arranged directly on the radiation main surface of the semiconductor chip. In particular, the converter element additionally comprises at least one phosphor that converts the primary radiation of the semiconductor into secondary radiation. In particular, the secondary radiation has a different wavelength maximum, preferably a longer wavelength maximum, than the primary radiation.

According to at least one embodiment, the phosphor is selected from a group consisting of YAG phosphors, LuAG phosphors, garnets, orthosilicates, alkaline earth nitrides, calsins and a combination thereof. In particular, the phosphor is an aluminum garnet, for example, a YAG:Ce or LuAG. In addition, the phosphor may comprise a content of at least 50 wt % in the crosslinked polyorganosiloxane. In other words, at least 50 wt % of the phosphor, preferably aluminum garnet, alkaline earth nitride or a combination thereof is dispersed in the crosslinked polyorganosiloxane after method step C).

According to at least one embodiment, the method comprises a further method step: Introduction of at least one phosphor into the crosslinked polyorganosiloxane or alkoxy-functionalized polyorganosiloxane resin. In particular, the phosphor is an aluminum garnet and is dispersed in the crosslinked polyorganosiloxane with a content of at most 25, 15, 10, 8, 5, 3 or 2 wt %.

According to at least one embodiment, the method comprises method step E): Arranging the crosslinked polyorganosiloxane as volume casting at least in regions within a recess of a housing of the optoelectronic component, the semiconductor being positively surrounded by the crosslinked polyorganosiloxane and having a cross-sectional thickness of at least 250 μm, wherein the phosphor is an aluminum garnet, alkaline earth nitride or a combination thereof, wherein the phosphor comprises a content of at most 25 wt % in the crosslinked polyorganosiloxane (4). If the phosphor is a combination of an aluminum garnet and alkaline earth nitride, "at most 25 wt %" means the sum of both parts by weight of the phosphor.

In particular, the thickness in cross-section comprises a value of at least 250 μm, for example, 300 μm.

According to at least one embodiment, the alkoxy-functionalized polyorganosiloxane resin is produced by hydrolysis of a precursor.

The crosslinked polyorganosiloxane is arranged in the beam path of the semiconductor according to at least one embodiment.

According to at least one embodiment, the crosslinked polyorganosiloxane is formed as a housing and/or lens.

According to at least one embodiment, the converter element is formed as a volume casting. Alternatively, the converter element can be formed as a layer with a layer thickness between 20 μm and 100 μm.

An optoelectronic component is also provided. The optoelectronic component is preferably produced using the method described above. This means that all features revealed for the method are also revealed for the optoelectronic component and vice versa.

BRIEF DESCRIPTION OF THE DRAWINGS

Further advantages, advantageous embodiments and further developments arise from the exemplary embodiments described below in connection with the figures.

In the exemplary embodiments and figures, identical, similar or identically acting elements can each be provided with the same reference signs. The represented elements and their proportions among themselves are not to be regarded as true to scale. Rather, individual elements such as layers, components, elements and areas can be displayed in exaggerated sizes for better displayability and/or better understanding.

DETAILED DESCRIPTION OF ILLUSTRATIVE EMBODIMENTS

Figure 1A:
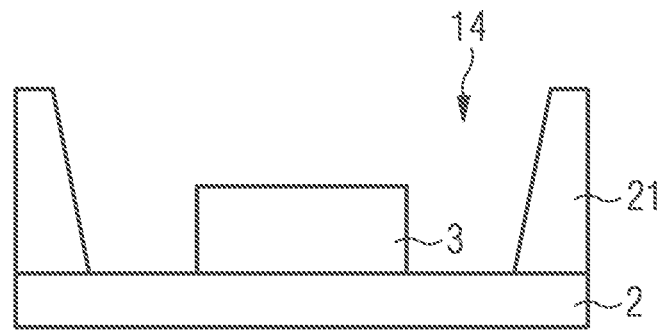
FIGS. 1A to 1C show a method of manufacturing an optoelectronic component according to an embodiment.
Figure 1B:
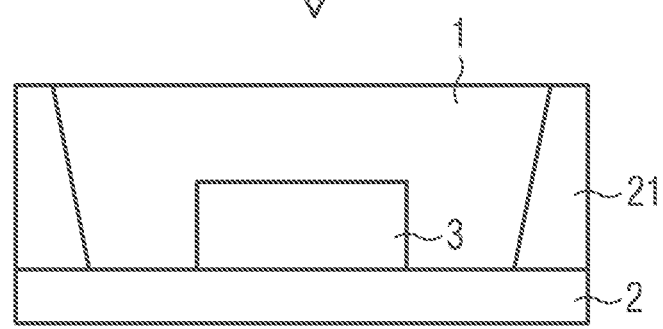
Figure 1C:
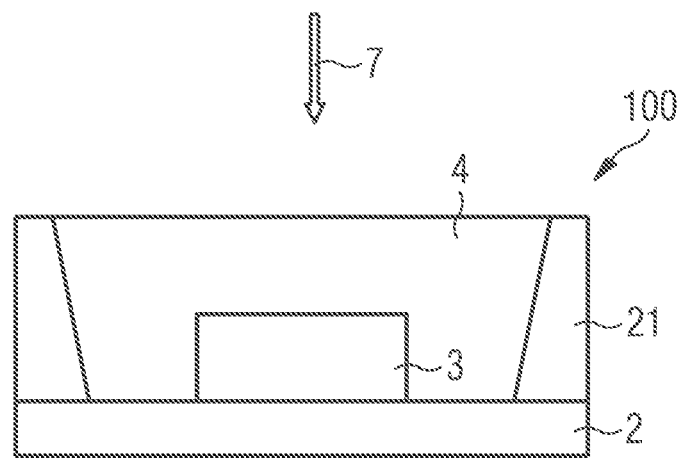

FIGS. 1A to 1C show a method for producing an optoelectronic component 100 according to an embodiment. FIG. 1A shows the providing of a semiconductor 3 on a substrate or carrier 2. For example, carrier 2 can be a printed circuit board or made of glass. The semiconductor 3 can be arranged within a housing 21 in a recess 14. FIG. 1B shows that an alkoxy-functionalized polyorganosiloxane resin 1 can be provided. Here the alkoxy-functionalized polyorganosiloxane resin is arranged in the recess 14 of housing 21. In particular, the alkoxy-functionalized polyorganosiloxane resin 1 forms a casting. Then, as shown in FIG. 1C, this alkoxy-functionalized polyorganosiloxane resin 1 can be crosslinked 7. For example, crosslinking 7 can take place thermally and/or by means of UV radiation, if necessary under air humidity. Thus, from the alkoxy-functionalized polyorganosiloxane resin 1 a three-dimensionally crosslinked polyorganosiloxane 4 is formed. The three-dimensionally crosslinked polyorganosiloxane 4 has a close-meshed three-dimensional SiO network and is particularly excellent high temperatures and/or blue light stable. In particular, the crosslinked polyorganosiloxane 4 comprises fewer organic groups in comparison to conventional silicones (see FIG. 2A, conventional silicone). The organic content is at most 25 wt % in relation to the total content of the crosslinked polyorganosiloxane 4. The permeability of the crosslinked polyorganosiloxane 4 is lower compared to that of conventional silicone. In addition, the crosslinked polyorganosiloxane 4 is harder compared to flexible conventional silicone. The crosslinked polyorganosiloxane 4 comprises a temperature stability of >200° C. compared to a conventional silicone, which has a temperature stability of approximately 150° C. On the other hand, when using the crosslinked polyorganosiloxane 4, a higher process temperature can be selected compared to conventional silicones, as this is more temperature stable.

Figure 2A:
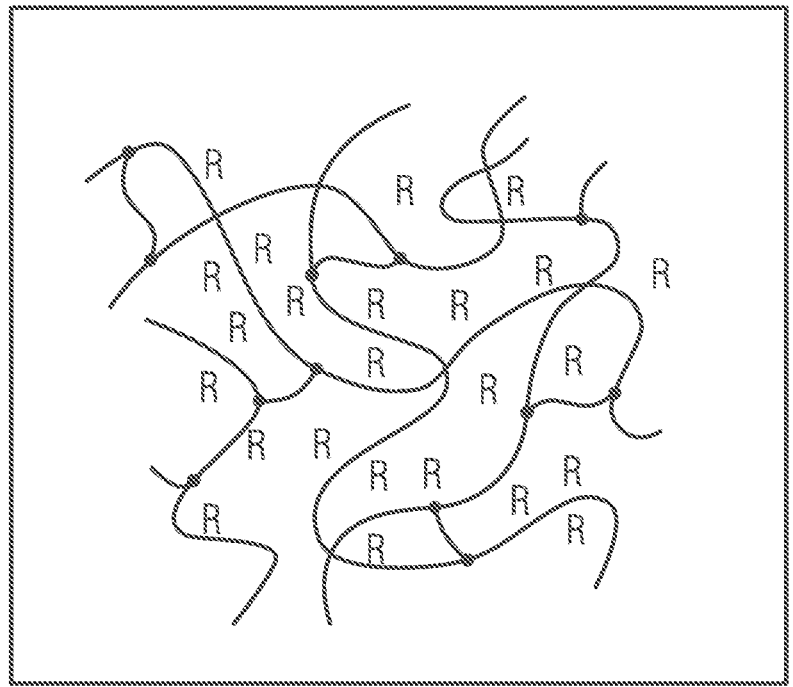
FIGS. 2A and 2B show the structure of a silicone and glass according to a comparison example.
Figure 2B:
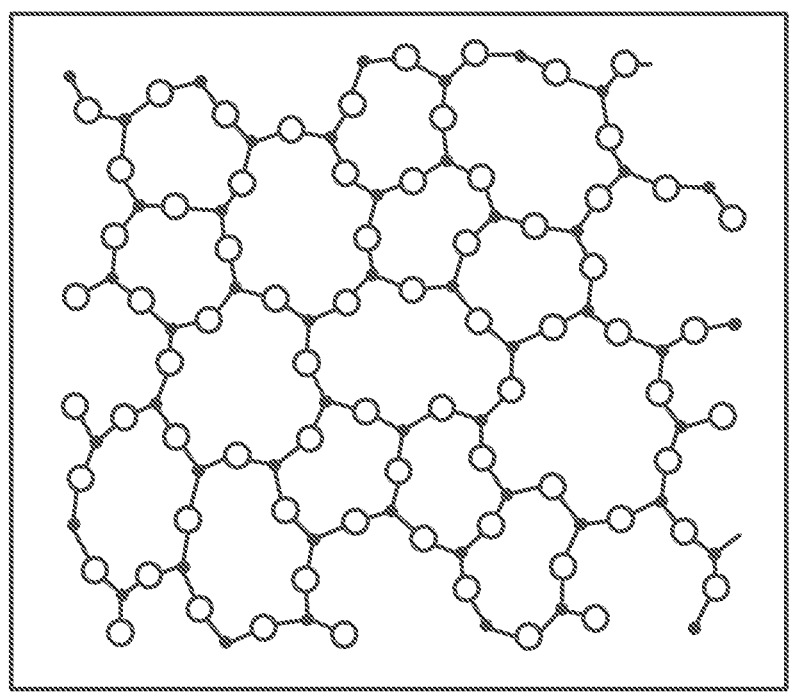

The crosslinked polyorganosiloxane 4 has an intermediate position between the structure of a conventional silicone and the structure of a glass or fused silicate with regard to the degree or density of crosslinking (see FIGS. 2A and 2B).

The alkoxy-functionalized polyorganosiloxane resin 1 can be cast. During casting, several milliliters of the alkoxy-functionalized polyorganosiloxane resin 1 can be filled into a container with a thickness of >2 mm, for example, crosslinked and a crosslinked polyorganosiloxane 4 can be produced.

In the so-called drop casting process, for example, a drop of the alkoxy-functionalized polyorganosiloxane resin 1 can be applied to a carrier, in particular thick layer thicknesses of about 0.5 mm or about 0.3 mm are produced.

Thin film thicknesses of <10 or <25 μm can be produced by spin coating.

Figure 3:
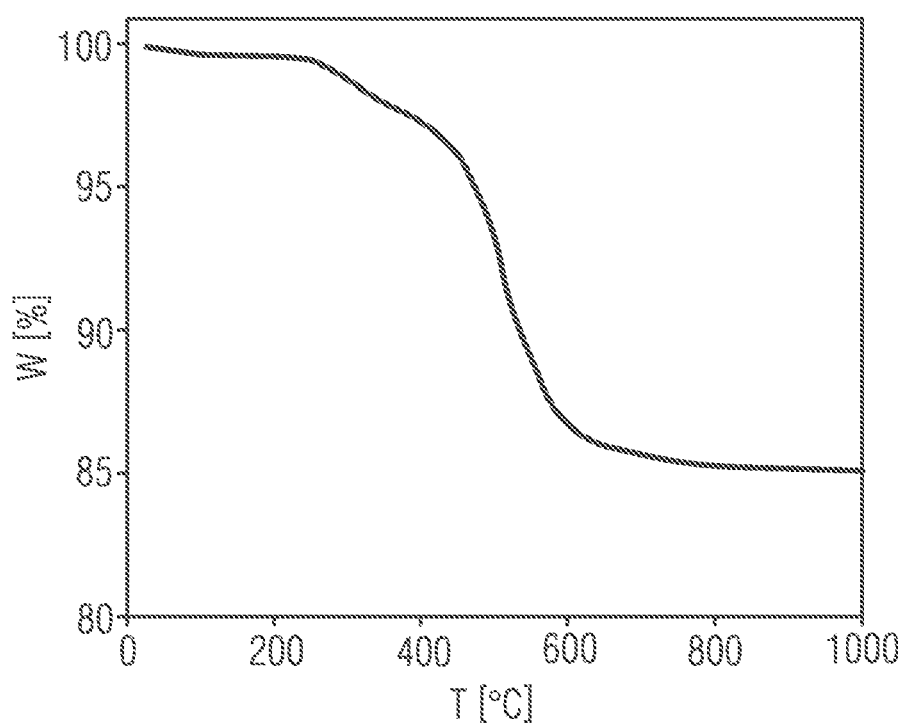
FIG. 3 shows a thermogravimetric analysis according to an embodiment.

FIG. 3 shows a thermal gravimetric analysis (TGA) according to an exemplary embodiment. The graph shows that only a small loss of mass at temperatures of <200° C. can be observed. From 600° C. a weight loss of approx. 15 wt % to approx. 85 wt % can be observed. Depending on the heating rate, a maximum weight loss of 25% can also be observed at 500° C. or 1000° C. (not shown here).

Figure 4A:
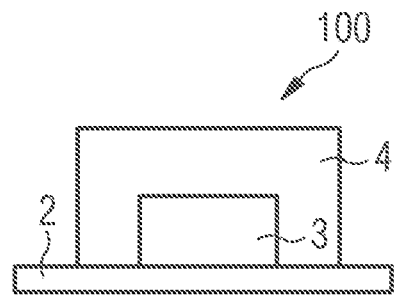
FIGS. 4A and 4B each represent an optoelectronic component in accordance with an embodiment.
Figure 4B:
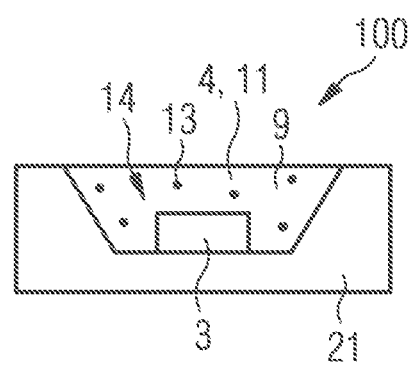

FIGS. 4A and 4B show schematic side views of optoelectronic components 100 in various embodiments. In particular, the optoelectronic component 100 is a light emitting diode (LED).

In the exemplary embodiment, as shown in FIG. 4A, the crosslinked polyorganosiloxane 4 covers the entire surface of the semiconductor 3. In particular the crosslinked polyorganosiloxane 4 has a constant thickness around the semiconductor 3.

According to FIG. 4B, the semiconductor 3 is arranged in a recess 14. The recess 14 can be filled with a casting 9 of the cross-linked polyorganosiloxane 4 as matrix material. The crosslinked polyorganosiloxane 4 may contain at least one phosphor 13 which is designed to convert primary radiation into secondary radiation. In other words, the cross-linked polyorganosiloxane 4 is arranged directly around semiconductor 3.

The exemplary embodiments described in connection with the figures and their features can also be combined with each other according to further exemplary embodiments, even if such combinations are not explicitly shown in the figures. Furthermore, the exemplary embodiments described in connection with the figures may have additional or alternative features according to the description in the general part.

The invention is not limited to these by the description based on the exemplary embodiments. Rather, the invention includes each new feature and each combination of features, which includes in particular each combination of features in the claims, even if this feature or this combination itself is not explicitly indicated in the claims or exemplary embodiments.

The invention claimed is:

1. A method for producing an optoelectronic component, the method comprising:
   providing a semiconductor capable of emitting primary radiation;
   providing an alkoxy-functionalized polyorganosiloxane resin; and
   crosslinking the alkoxy-functionalized polyorganosiloxane resin to form a three-dimensionally crosslinked polyorganosiloxane,
   wherein an organic portion of the three-dimensionally crosslinked polyorganosiloxane is up to 25 wt %.

2. The method according to claim 1, wherein crosslinking comprises condensation crosslinking.

3. The method according to claim 1, wherein the organic portion of the three-dimensionally crosslinked polyorganosiloxane is between 13 wt % and 18 wt % inclusive.

4. The method according to claim 1, wherein the crosslinked polyorganosiloxane has a Shore A hardness greater than 70.

5. The method according to claim 1, wherein the alkoxy-functionalized polyorganosiloxane resin is an alkoxy-functionalized methylphenyl silicone resin having an alkoxy content of 17+/−4 wt %.

6. The method according to claim 1, wherein the alkoxy-functionalized polyorganosiloxane resin is an alkoxy-functionalized methyl silicone resin having an alkoxy content of 35+/−4 wt %.

7. The method according to claim 1, wherein the crosslinked polyorganosiloxane is arranged in a beam path of the semiconductor.

8. The method according to claim 1, further comprising applying the alkoxy-functionalized polyorganosiloxane resin as a converter element on a radiation main surface of the semiconductor, wherein the converter element comprises at least one phosphor which converts the primary radiation into a secondary radiation.

9. The method according to claim 8, wherein the phosphor is an aluminum garnet, alkaline earth nitride or a combination thereof, and wherein the phosphor comprises a content of at least 50 wt % in the crosslinked polyorganosiloxane.

10. The method according to claim 1, further comprising arranging the crosslinked polyorganosiloxane as a volume casting at least in regions within a recess of a housing of the optoelectronic component, the semiconductor being positively surrounded by the crosslinked polyorganosiloxane and having a cross-sectional thickness of at least 250 μm, wherein a phosphor is an aluminum garnet, alkaline earth nitride or a combination thereof, and wherein the phosphor comprises a content of at most 25 wt % in the crosslinked polyorganosiloxane.

11. The method according to claim 1, wherein the crosslinked polyorganosiloxane is formed as a housing or lens.

12. The method according to claim 1, wherein providing the alkoxy-functionalized polyorganosiloxane resin comprises casting, drop casting, spin coating, doctor blading, spray coating or compression molding.

13. The method according to claim 1, wherein crosslinking the alkoxy-functionalized polyorganosiloxane resin comprises applying temperature and/or humidity or UV radiation.

14. The method according to claim 1, wherein the alkoxy-functionalized polyorganosiloxane resin is produced by hydrolysis of a precursor.

15. An optoelectronic device formed by the method according to claim 1.

16. The method according claim 1, wherein the three-dimensionally crosslinked polyorganosiloxane is a close meshed three-dimensionally crosslinked polyorganosiloxane.

17. The method according to claim 16, wherein the three-dimensionally crosslinked polyorganosiloxane forms a close-meshed three-dimensional Si—O network.

18. The method according to claim 1, wherein the crosslinked polyorganosiloxane has the following structural formula:

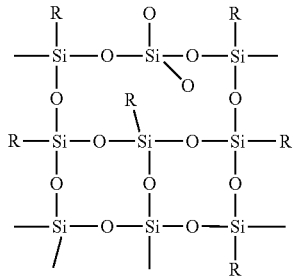

wherein R is a methyl-radical and/or a phenyl-radical.

19. A method for producing an optoelectronic component, the method comprising:
   providing a semiconductor capable of emitting primary radiation;
   providing an alkoxy-functionalized polyorganosiloxane resin; and crosslinking the alkoxy-functionalized polyorganosiloxane resin to form a three-dimensionally crosslinked polyorganosiloxane,
wherein an organic portion of the three-dimensionally crosslinked polyorganosiloxane is up to 25 wt %, and
wherein the three-dimensionally crosslinked polyorganosiloxane forms a close meshed three-dimensional Si—O network.

* * * * *